United States Patent
Nogami et al.

(10) Patent No.: US 6,989,717 B2
(45) Date of Patent: Jan. 24, 2006

(54) CIRCUIT AND METHOD FOR SWITCHING GAINS OF PREAMPLIFIER

(75) Inventors: Masamichi Nogami, Tokyo (JP);
Kuniaki Motoshima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 49 days.

(21) Appl. No.: 10/477,945

(22) PCT Filed: Dec. 3, 2002

(86) PCT No.: PCT/JP02/12684

§ 371 (c)(1),
(2), (4) Date: Nov. 18, 2003

(87) PCT Pub. No.: WO03/071674

PCT Pub. Date: Aug. 28, 2003

(65) Prior Publication Data

US 2004/0145419 A1    Jul. 29, 2004

(30) Foreign Application Priority Data

Feb. 19, 2002    (JP)    ............................. 2002-041944

(51) Int. Cl.
*H03F 3/08*    (2006.01)
(52) U.S. Cl. .................... 330/308; 250/214 A
(58) Field of Classification Search ............ 330/86, 330/110, 282, 308; 250/214 A, 214 AG
See application file for complete search history.

(56) References Cited

U.S. PATENT DOCUMENTS

| 6,140,878 A | * | 10/2000 | Masuta .................. 330/308 |
| 6,246,282 B1 | * | 6/2001 | Oono et al. .............. 330/86 |
| 6,246,284 B1 | * | 6/2001 | Nemoto ................. 330/110 |
| 6,307,433 B1 | * | 10/2001 | Ikeda .................... 330/86 |

FOREIGN PATENT DOCUMENTS

| JP | 2000-252774 A | 9/2000 |
| JP | 2000-315923 A | 11/2000 |
| JP | 2001-144552 A | 5/2001 |
| JP | 2001-196877 A | 7/2001 |

* cited by examiner

Primary Examiner—Henry Choe

(74) Attorney, Agent, or Firm—Birch, Stewart, Kolasch & Birch, LLP

(57) ABSTRACT

A pre-amplifier amplifies an output current of a photodetector that converts a burst optical signal into an electrical signal, and outputs an electric voltage signal. A gain switching circuit is connected with a serial circuit comprising a resistor and a switch and a serial circuit comprising a resistor and a switch, in parallel with a feedback resistor. The gain switching circuit includes an arrangement to receive the electric voltage signal output from the pre-amplifier, close the switch at a specific bit position, close the switch at the other specific bit position, upon occurrence of a situation that the switch is to be closed, provided that the switch is closed.

10 Claims, 8 Drawing Sheets

CIRCUIT AND METHOD FOR SWITCHING GAINS OF PREAMPLIFIER

This application is the national phase under 35 U.S.C. § 371 of PCT International Application No. PCT/JP02/12684 which has an International filing date of Dec. 3, 2002, which designated the United States of America.

TECHNICAL FIELD

The present invention relates to a method of and circuit for switching gain of a pre-amplifier.

BACKGROUND ART

A pre-amplifier is used for a light receiver in an optical communication system. The optical communication system is, for example, asynchronous transfer mode-passive optical network (hereinafter, "ATM-PON"), which is an international standard communication system according to the ITU-T recommendation G.983. According to this system, one station can realize a point-to-multi-point transmission with a plurality of subscriber apparatuses with the time division multiplexing, so that transmission can be realized at low cost.

A pre-amplifier is disclosed, for example, in Japanese Patent Application Laid-open Publication No. 2000-315923 (i.e., burst light receiving circuit). FIG. 4 is a circuit diagram of the conventional gain switching circuit for a pre-amplifier. FIG. 5 is a time chart of operation of the conventional gain switching circuit. FIG. 6 is a flowchart of operation of the conventional gain switching circuit.

A photodetector 1 converts a light signal into an electric signal. A pre-amplifier 2 receives the electric signal (i.e., current signal) A. This pre-amplifier 2 includes an operation amplifier 2a and a feedback resistor 2b. The pre-amplifier 2 is a transimpedance amplifier (hereinafter, "TIA") that amplifies an input current signal and outputs a voltage signal.

The feedback resistor 2b of the TIA 2A is connected in parallel with a serial circuit of a resistor 5 and a diode 8, a serial circuit of a resistor 6 and a switching MOS transistor 9, and a serial circuit of a resistor 7 and a switching MOS transistor 10 respectively.

A gain switching circuit 31 has identification circuits 11 and 12 and flip-flop circuits 13 and 14, thereby to receive an output (i.e., voltage signal) b from the TIA 2, and control ON and OFF of the MOS transistors 9 and 10 according to the output level. The gain switching circuit 31 switches over a feedback resistance of the TIA 2.

In other words, the output (i.e. voltage signal) b from the TIA 2 is input to positive phase input terminals (+) of the identification circuits 11 and 12. A reference voltage V1 is input to a negative phase input terminal (−) of the identification circuit 11, and a reference voltage V2 (V1<V2) is input to a negative phase input terminal (−) of the identification circuit 12.

An output terminal of the identification circuit 11 is connected to a clock input terminal C of the flip-flop circuit 13, and a data input terminal D of the flip-flop circuit 13 is connected to a power source VH. A signal d output from a data output terminal Q of the flip-flop circuit 13 is applied to a gate electrode of the MOS transistor 9, thereby to turn ON the MOS transistor 9. As a result, the resistor 6 is connected in parallel to the feedback resistor 2b.

An output terminal of the identification circuit 12 is connected to a clock input terminal C of the flip-flop circuit 14, and a data input terminal D of the flip-flop circuit 14 is connected to the power source VH. A signal e output from a data output terminal Q of the flip-flop circuit 14 is applied to a gate electrode of the MOS transistor 10, thereby to turn ON the MOS transistor 10. As a result, the resistor 7 is connected in parallel to the feedback resistor 2b.

An external reset signal (RESET) c is input to a reset terminal R of the flip-flop circuits 13 and 14 respectively. The reset signal (RESET) c is input prior to the input of a light burst signal. Therefore, the flip-flop circuits 13 and 14 are initialized at the head of each burst signal. Accordingly, the MOS transistors 9 and 10 are in the OFF (open) operation state at the head of each burst signal.

The operation of the conventional gain switching circuit will be explained next with reference to FIG. 5. For the sake of convenience of explanation, it is assumed that the diode 8 does not operate.

In FIG. 5, (a) is a waveform diagram of current output from the photodetector 1, that is, a waveform of current input to the TIA 2. Light burst signals are input to the photodetector 1 in the order of bursts #1, #2, and #3. The bursts #1, #2, and #3 are data signals having a bit pattern of "1010" respectively. The amplitude increases in this order.

(b) is a waveform diagram of a relationship between a waveform of an output voltage (Vout) b from the TIA 2 and the reference voltages V1 and V2. The output voltage (Vout) b from the TIA 2 to the burst #1 is at the reference voltage V1 or below. The output voltage (Vout) b from the TIA 2 to the burst #2 exceeds the reference voltage V1, but does not exceed the reference voltage V2. The output voltage (Vout) b from the TIA 2 to the burst #3 exceeds the reference voltage V2.

(c) is a waveform diagram of the reset signal (RESET) c. The reset signal (RESET) c is input at the head of the bursts #1, #2, and #3 respectively. Accordingly, the flip-flop circuits 13 and 14 are at the initialized state at the head of each burst signal. The MOS transistors 9 and 10 are in the OFF (open) operation state at the head of each burst signal. In other words, the TIA 2 is in the conversion gain determined by the feedback resistor 2b at the head of each burst signal.

(d) and (e) are waveform diagrams of the operation of the identification circuits 11 and 12 and the flip-flop circuits 13 and 14. In (d), as the amplitude of the burst #1 output from the TIA 2 is at the reference voltage V1 or below, the identification circuit 11 does not operate, but the TIA 2 amplifies the burst #1 in the original conversion gain.

As the amplitude of the first bit of the burst #2 exceeds the reference voltage V1, the identification circuit 11 sets the output level from the level "0" to the level "1", and holds this level until when the reset signal (RESET) c is input. A signal d of the level "1" is output from the data output terminal Q of the flip-flop circuit 13, and the MOS transistor 9 is turned ON, thereby to connect the resistor 6 in parallel with the feedback resistor 2b. As a result, in the burst #2, the conversion gain of the TIA 2 is switched over from the original conversion gain into a small conversion gain that is determined according to a feedback resistance due to the parallel connection between the feedback resistor 2b and the resistor 6.

As the amplitude of the first bit of the burst #3 exceeds the reference voltage V1, the identification circuit 11 sets the output level from the level "0" to the level "1". A signal d of the level "1" is output from the data output terminal Q of the flip-flop circuit 13, and the MOS transistor 9 is turned ON, thereby to connect the resistor 7 in parallel with the feedback resistor 2b.

In (e), as the amplitude of the first bit of the burst #3 exceeds the reference voltage V2, the identification circuit 12 sets the output level from the level "0" to the level "1". A signal e of the level "1" is output from the data output terminal Q of the flip-flop circuit 14, and the MOS transistor 10 is turned ON, thereby to connect the resistor 7 in parallel with the feedback resistor 2b. As a result, in the burst #3, the conversion gain of the TIA 2 is switched over from the original conversion gain into a smaller conversion gain that is determined according to a feedback resistance due to the parallel connection between the feedback resistor 2b and the resistors 6 and 7.

The flowchart shown in FIG. 6 summarizes the above operation. Referring to FIG. 6, at step S81, the gain switching circuit 31 receives the reset signal (RESET) at the head of the burst signal. In other words, when the reset signal (RESET) is input, the flip-flop circuits 13 and 14 are reset, and the MOS transistors 9 and 10 are in the OFF state, thereby to return the gain of the TIA 2 to the original conversion gain.

When the light burst signal is input to the photodetector 1 in this state, the output level identification circuits 11 and 12 of the TIA 2 detect whether these signals exceed the respective threshold values V1 and V2 (step S82).

When the output from the TIA 2 is at or below the reference voltage V1 (No at step S83), the gain switching circuit 31 does not turn ON the MOS transistor 9. When the output from the TIA 2 exceeds the reference voltage V1 (Yes at step S83), the gain switching circuit 31 does not turn ON the MOS transistor 9, and maintains the ON state of this transistor (step S84).

When the output from the TIA 2 is lower than the reference voltage V2 (No at step S85), the gain switching circuit 31 does not turn ON the MOS transistor 10. When the output from the TIA 2 is at or above the reference voltage V2 (Yes at step S85), the gain switching circuit 31 does not turn ON the MOS transistor 10, and maintains the ON state of this transistor (step S86).

As explained above, when the output level of the TIA 2 is at or below the reference voltage V1, the conventional gain switching circuit for a pre-amplifier sets the conversion gain of the TIA 2 to the original gain. When the output level of the TIA 2 exceeds the reference voltage V1 and is at or below the reference voltage V2, the conventional gain switching circuit turns ON only the MOS transistor 9, and connects the resistor 6 in parallel with the feedback resistor 2b. When the output level of the TIA 2 exceeds the reference voltage V2, the conventional gain switching circuit turns ON both the MOS transistors 9 and 10, and connects the resistors 6 and 7 in parallel with the feedback resistor 2b. The conventional gain switching circuit switches over the conversion gain of the TIA 2 in this way.

However, as can be understood from the control flow shown in FIG. 6, when the amplitude of the output voltage from the TIA exceeds the reference voltage, the conventional gain switching circuit turns ON the MOS transistor without exception. Therefore, when various kinds of waveform distortions such as ringing, amplitude fluctuation, and signal sag occur, the conventional gain switching circuit does not always switch the gain at the head of the burst signal. There is a possibility that the conventional gain switching circuit switches over the gain at an optional bit position within the burst signal, which makes it difficult to follow the threshold value. Further, depending on the waveform distortion or the like, the conventional gain switching circuit may set the conversion gain to a level different from a target gain.

These problems will be explained in detail below with reference to FIG. 4 and FIG. 6 to FIG. 8. FIG. 7 is a time chart illustrating an example of a malfunctioning of the conventional gain switching circuit shown in FIG. 4. FIG. 8 is a graph of input-output characteristic of the TIA 2 as the pre-amplifier shown in FIG. 4.

In FIG. 7, (a') is a waveform of a current output from the photo detector 1, that is, a waveform of a current input to the TIA 2. This waveform is of a state that light burst signals of a first burst and a second burst are input in this order to the photo detector 1. The first burst and the second burst are data signals having a bit pattern of "1010" respectively. The amplitude increases in this order. A waveform distortion such as a large ringing is observed at a rising portion of each bit "1".

(b') is an illustration of a relationship between a waveform of the output voltage (Vout) from the TIA 2 and the reference voltages V1 and V2. In a waveform of the output from the TIA 2 to the first burst, a waveform indicated by a dotted line 61 is a target signal waveform, which is substantially at the same level as the reference voltage V1. On the other hand, a waveform indicated by a solid line 62 becomes a cause of generating a malfunctioning. This waveform may or may not exceed the reference voltage V1 at random due to the ringing or the amplitude fluctuation.

In a waveform of the output from the TIA 2 to the second burst, a waveform indicated by a dotted line 63 is a target signal waveform, which exceeds the reference voltage V1 and does not exceed the reference voltage V2. On the other hand, a waveform indicated by a solid line 64 becomes a cause of generating a malfunctioning. The first bit has a large signal sag Td that exceeds the reference voltage V2. Each bit thereafter has a portion large dropped to below the reference voltage V1.

(c') is an illustration of a waveform of a reset signal (RESET). The reset signal (RESET) is input at the head of the first burst and the second burst respectively. Based on this, the flip-flop circuits 13 and 14 are initialized at the head of each burst signal. The MOS transistors 9 and 10 are in the OFF (closed) operating state at the head of each burst signal. In other words, at the head of each burst signal, the TIA 2 is in the original conversion gain of the TIA 2 that is determined by the feedback resistor 2b.

(d') and (e') are waveform diagrams for explaining the operations of the identification circuits 11 and 12, and the flip-flop circuits 13 and 14. Referring to (d'), when the waveform of a signal output from the TIA 2 to the first burst is the target signal waveform indicated by the dotted line 61 of (b'), the amplitude of the first bit exceeds the reference voltage V1. Therefore, the identification circuit 11 can correctly recognize this signal waveform at the first bit position. Accordingly, the MOS transistor 9 can be turned ON at the timing of the first bit.

However, when the waveform of a signal output from the TIA 2 to the first burst is that indicated by the solid line 62 of (b'), the amplitude exceeds the reference voltage V1 at not only the first bit position but also at an optional bit position thereafter. Accordingly, the MOS transistor 9 can be turned ON at an optional bit position within the burst signal. For example, as indicated by a solid line 66, the MOS transistor 9 is turned ON at a fifth bit position, which causes the conversion gain to be switched over in the middle of the burst signal.

Referring to (e'), when the waveform of a signal output from the TIA 2 to the second burst is the target signal waveform indicated by the dotted line 63 of (b'), the amplitude of the first bit exceeds only the reference voltage V1 and does not exceed the reference voltage V2. Therefore, only the identification circuit 11 operates, and the identification circuit 12 does not operate. In this case, as indicated by a dotted line 67, the MOS transistor maintains the OFF state from the first bit timing, and only the MOS transistor 9 are ON as in (d').

However, when the waveform of a signal output from the TIA 2 to the first burst is the signal waveform having the large sag as indicated by the solid line 64 in (b'), the amplitude of the first bit exceeds the reference voltage V2. Therefore, the identification circuit 12 can correctly recognize this signal waveform at the first bit position as indicated by a solid line 68. Accordingly, the MOS transistor 10 can be turned ON at the timing of the first bit. In this case, the conversion gain obtained by connecting only the resistor 6 to the feedback resistor 2b in parallel is the target gain. However, the resistor 7 is further set to the conversion gain different from the target gain when the resistor 7 is connected in parallel, which makes the output amplitude smaller than the target amplitude.

FIG. 8 is an explanatory diagram of the above operation using input-output characteristic of the TIA 2. The characteristics 71, 72, and 73 correspond to the operation shown in FIG. 5. In other words, the characteristic 71 is input-output characteristic when the TIA 2 operates in the original conversion gain as shown by the burst #1. Next, in the burst #2, the MOS transistor 9 is ON at the gain switching point A as the timing when the amplitude exceeds the reference voltage V1. Therefore, the gain is switched over to change the characteristic to the input-output characteristic 72. Next, in the burst #3, the MOS transistors 9 and 10 are ON at the gain switching point B as the timing when the amplitude exceeds the reference voltage V2. Therefore, the gain is switched over to change the characteristic to the input-output characteristic 73.

On the other hand, in the operation shown in FIG. 7, the first burst is at a level equivalent to the reference voltage V1, that is, a level near the gain switching point A. Therefore, the amplitude exceeds the reference voltage V1 at an optional bit position not only at the first bit position due to the ringing and the amplitude fluctuation of the waveform. Consequently, t he MOS transistor 9 is turned ON at an optional bit position within the burst signal.

In the second burst, when the first bit exceeds the reference voltage V2 by error due to the ringing of the waveform or the like, the MOS transistors 9 and 10 are turned ON at the first bit position. Therefore, the gain switching point B shifts to a gain switching point B' at the small amplitude side, and the characteristic 73 changes to a characteristic 74 that starts at the gain switching point B' at the small amplitude side. Consequently, the output amplitude becomes much smaller than the target amplitude.

DISCLOSURE OF THE INVENTION

It is an object of the present invention to provide a gain switching circuit and a method of switching gain of a pre-amplifier that can switch the gain at only a specific bit position of a burst signal, thereby to obtain a suitable conversion gain corresponding to the level of each burst signal.

It is an object of the present invention to solve at least the problems in the conventional technology.

A gain switching circuit according to one aspect of the present invention is for the pre-amplifier, which amplifies an output current of the photodetector, which converts a burst optical signal into an electrical signal, to generate an electric voltage signal, the pre-amplifier including a parallel connected operation amplifier and a feedback resistor. A first serial circuit including a first resistor and a first switch is connected in parallel with the pre-amplifier, and a second serial circuit including a second resistor and a second switch is connected in parallel with the first serial circuit. The gain switching circuit includes an arrangement to receive the electric voltage signal, close the first switch at a specific bit position, close the second switch at other specific bit position, upon occurrence of a situation that the second switch is to be closed, provided that the first switch is closed.

A method according to another aspect of the present invention is a method of switching gain of a pre-amplifier, which amplifies an output current of a photodetector, which converts a burst optical signal into an electrical signal, to generate an electric voltage signal, the pre-amplifier including a parallel connected operation amplifier and a feedback resistor. A first serial circuit including a first resistor and a first switch is connected in parallel with the pre-amplifier, and a second serial circuit including a second resistor and a second switch is connected in parallel with the first serial circuit. The method includes receiving the electric voltage signal; closing the first switch at a specific bit position based on the electric voltage signal; and closing the second switch, upon occurrence of a situation that the second switch is to be closed, provided that the first switch is closed.

The other objects, features and advantages of the present invention are specifically set forth in or will become apparent from the following detailed descriptions of the invention when read in conjunction with the accompanying drawings.

BEST MODE FOR CARRYING OUT THE INVENTION

Exemplary embodiments of a gain switching circuit for a pre-amplifier according to the present invention will be explained in detail below with reference to the accompanying drawings.

Figure 1:
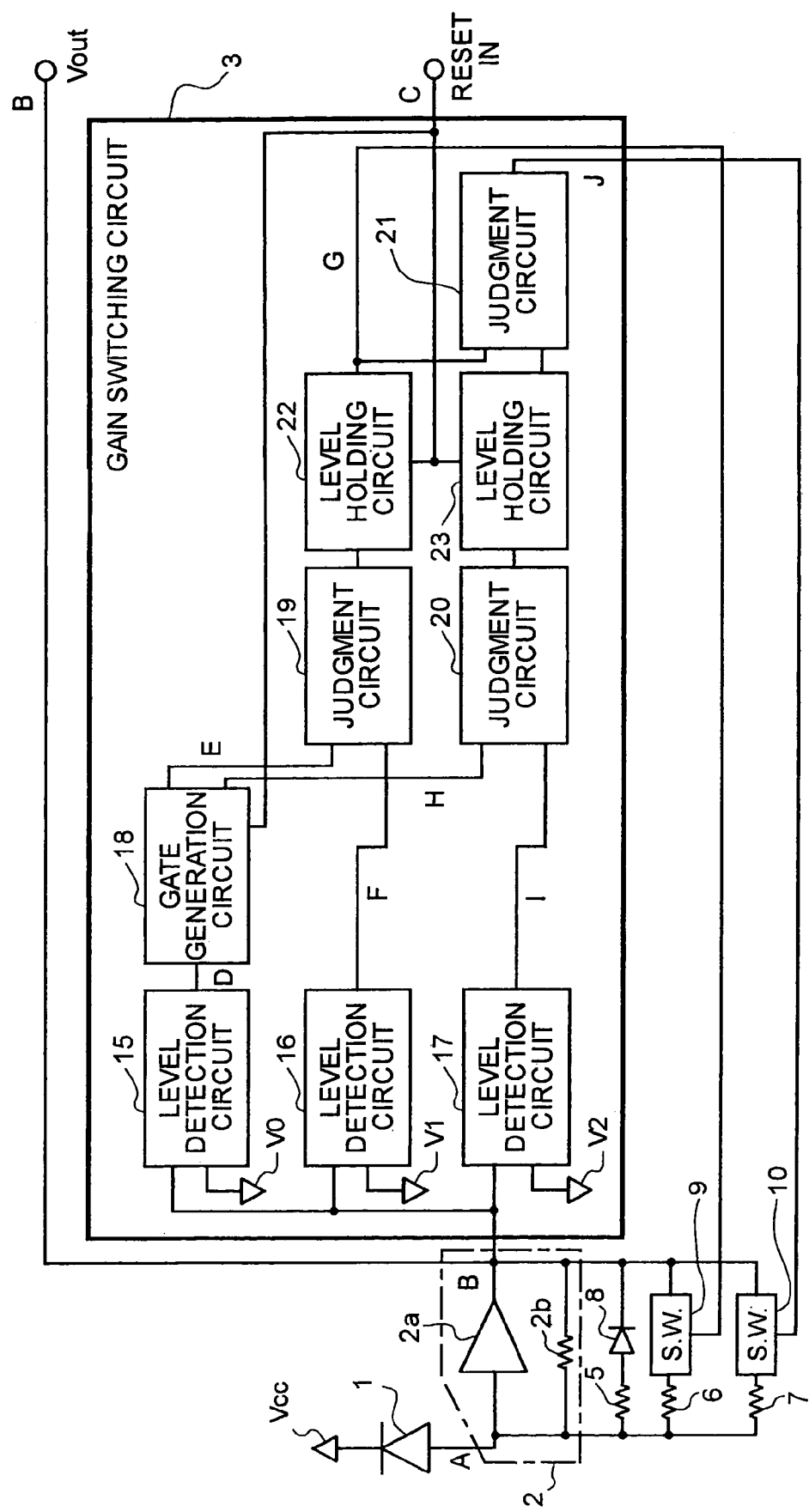
FIG. 1 is a circuit diagram of a gain switching circuit according to an embodiment of the present invention.

FIG. 1 is a circuit diagram of a gain switching circuit according to an embodiment of the present invention. In FIG. 1, the pre-amplifier 2 that receives an output (i.e., current signal) A from the photodetector 1 that converts a light signal into an electric signal consists of the operation amplifier 2a and the feedback resistor 2b. The pre-amplifier 2 is a transimpedance amplifier (TIA) that amplifies an input current signal and outputs a voltage signal.

Figure 4:
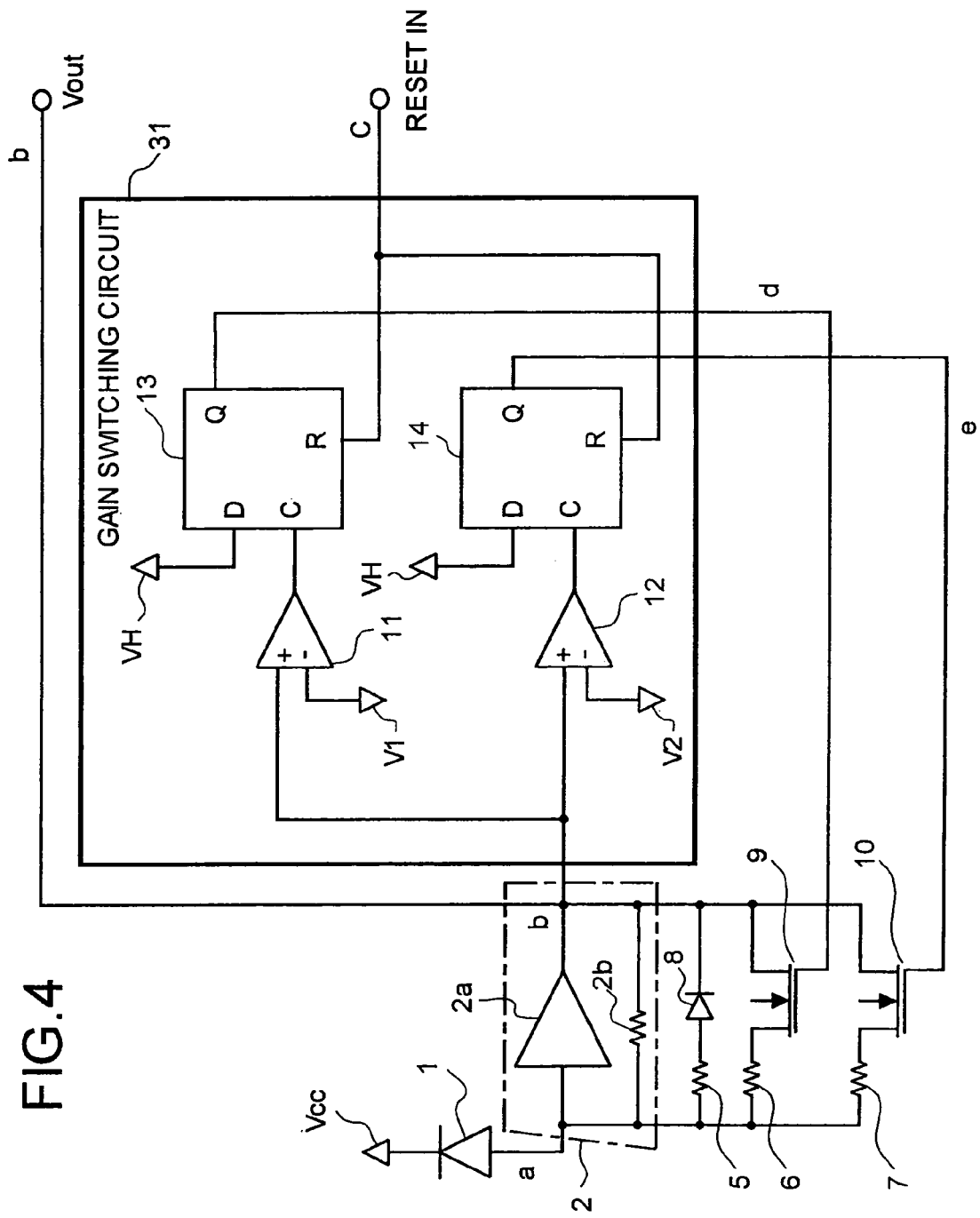
FIG. 4 is a circuit diagram of a conventional gain switching circuit.

The feedback resistor 2b of the TIA 2A is connected in parallel with the serial circuit of the resistor 5 and the diode 8, the serial circuit of the resistor 6 and the switching MOS transistor 9 (hereinafter, "SW 9"), and the serial circuit of the resistor 7 and the switching MOS transistor 10 (hereinafter, "SW 10") respectively. The above structure is similar to that shown in FIG. 4.

The serial circuit of the resistor 5 and the diode 8 may not be provided. Consider the serial circuit of the resistor 5 and the diode 8. When the SW 9 and the SW 10 are OFF, the conversion gain of the TIA 2 becomes a gain determined by a value of the feedback resistor 2b or a gain determined by a parallel resistance of the feedback resistor 2b and the resistor 5. To facilitate the explanation, the serial circuit of the resistor 5 and the diode 8 is disregarded, and it is assumed that the gain determined by the value of the feedback resistor 2b is the original conversion gain of the TIA 2.

The gain switching circuit 3 according to the present embodiment comprises level detection circuits 15, 16, and 17, a gate generation circuit 18, judgment circuits 19, 20, and 21, and level holding circuits 22 and 23. The gain switching circuit 3 switches over the gain at a specific bit position of a burst signal. Thereafter, when a cause of a switching to a different gain occurs, the gain switching circuit 3 does not carry out a single switching operation, but switches the gain at other specific bit position subject to a condition that the gain is switched over at a bit position one before without exception. With this arrangement, the gain is switched over to a suitable conversion gain that fits the level of each burst signal.

As one example, when a bit pattern of each burst signal is "1010", the gain switching circuit 3 switches the gain at a first bit position. Thereafter, when a cause of a gain switching occurs at a third bit position, the gain switching circuit 3 does not carry out a single switching operation, but switches the gain at the third bit position subject to a condition that the gain is switched over at the first bit position without exception.

An output (i.e., voltage signal) B of the TIA 2 is input to one input terminal of the level detection circuits 15, 16, and 17 respectively. A reference voltage V0 as a first reference voltage is input to the other input terminal of the level detection circuit 15. A reference voltage V1 as a second reference voltage is input to the other input terminal of the level detection circuit 16. A reference voltage V2 as a third reference voltage is input to the other input terminal of the level detection circuit 17. These reference voltages are in a relationship of V0<V1<V2.

An output D from the level detection circuit 15 is input to the gate generation circuit 18. Outputs E (i.e., first gate signal) and H (i.e., second gate signal) from the gate generation circuit 18 are input to one input terminal of the judgment circuits 19 and 20 respectively. An output F from the level detection circuit 16 is input to the other input terminal of the judgment circuit 19. An output I from the level detection circuit 17 is input to the other input terminal of the judgment circuit 20.

An output from the judgment circuit 19 is input to the level holding circuit 22. An output G from the level holding circuit 22 becomes a control signal of the SW 9, and is also input to one input terminal of the judgment circuit 21. An output from the judgment circuit 20 is input to the level holding circuit 23. An output from the level holding circuit 23 is input to the other input terminal of the judgment circuit 21. An output J from the judgment circuit 21 becomes a control signal of the SW 10.

An external reset signal (RESET) C is input to the gate generation circuit 18 and the level holding circuits 22 and 23 respectively. As the reset signal (RESET) C is input prior to the input of the optical burst signal, the gate generation circuit 18 and the level holding circuits 22 and 23 are initialized at the head of each burst signal. Therefore, the SW 9 and the SW 10 are in the OFF (open) operation state at the head of each burst signal respectively.

Figure 2:
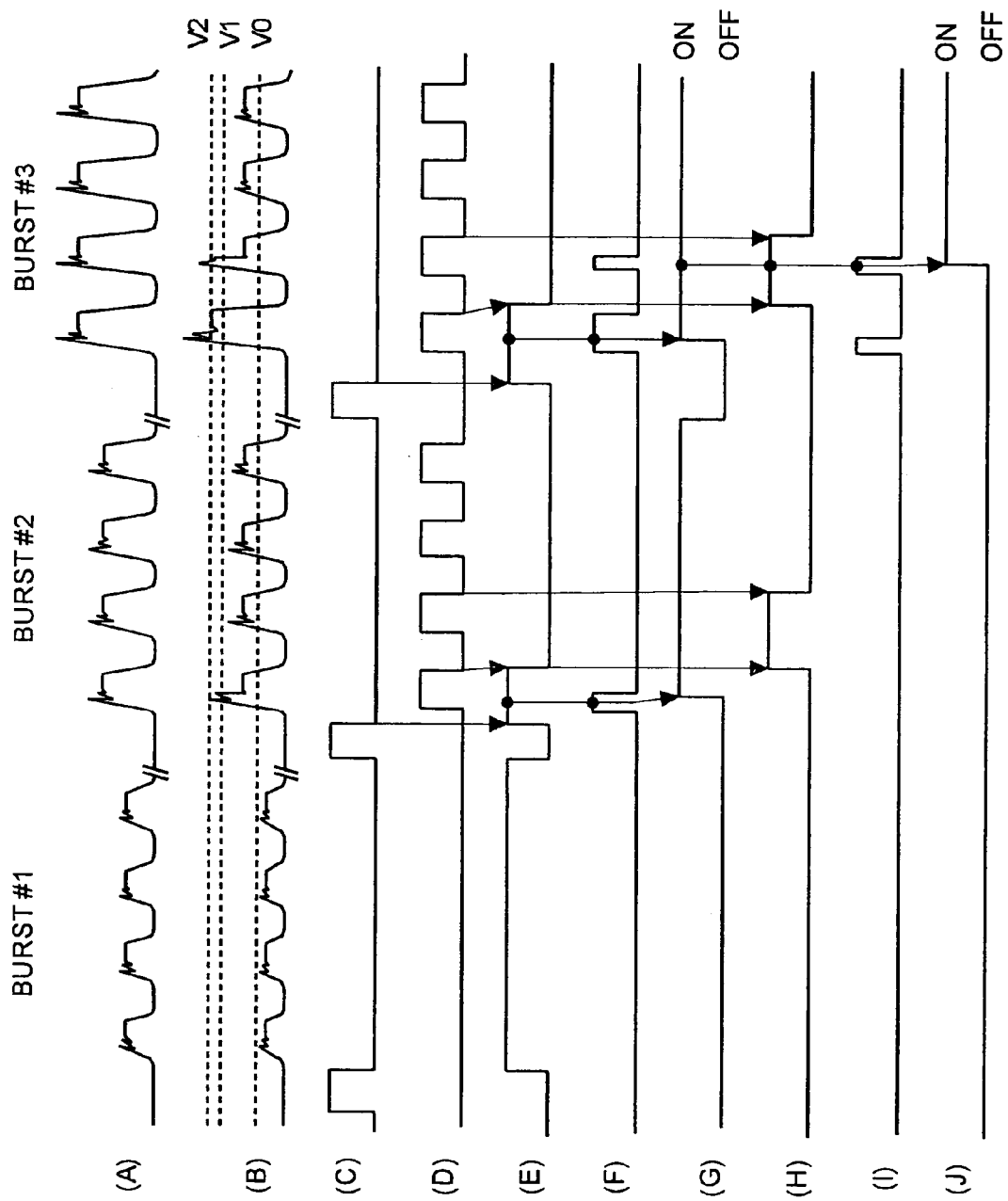
FIG. 2 is a time chart of operation of the gain switching circuit shown in FIG. 1.
Figure 3:
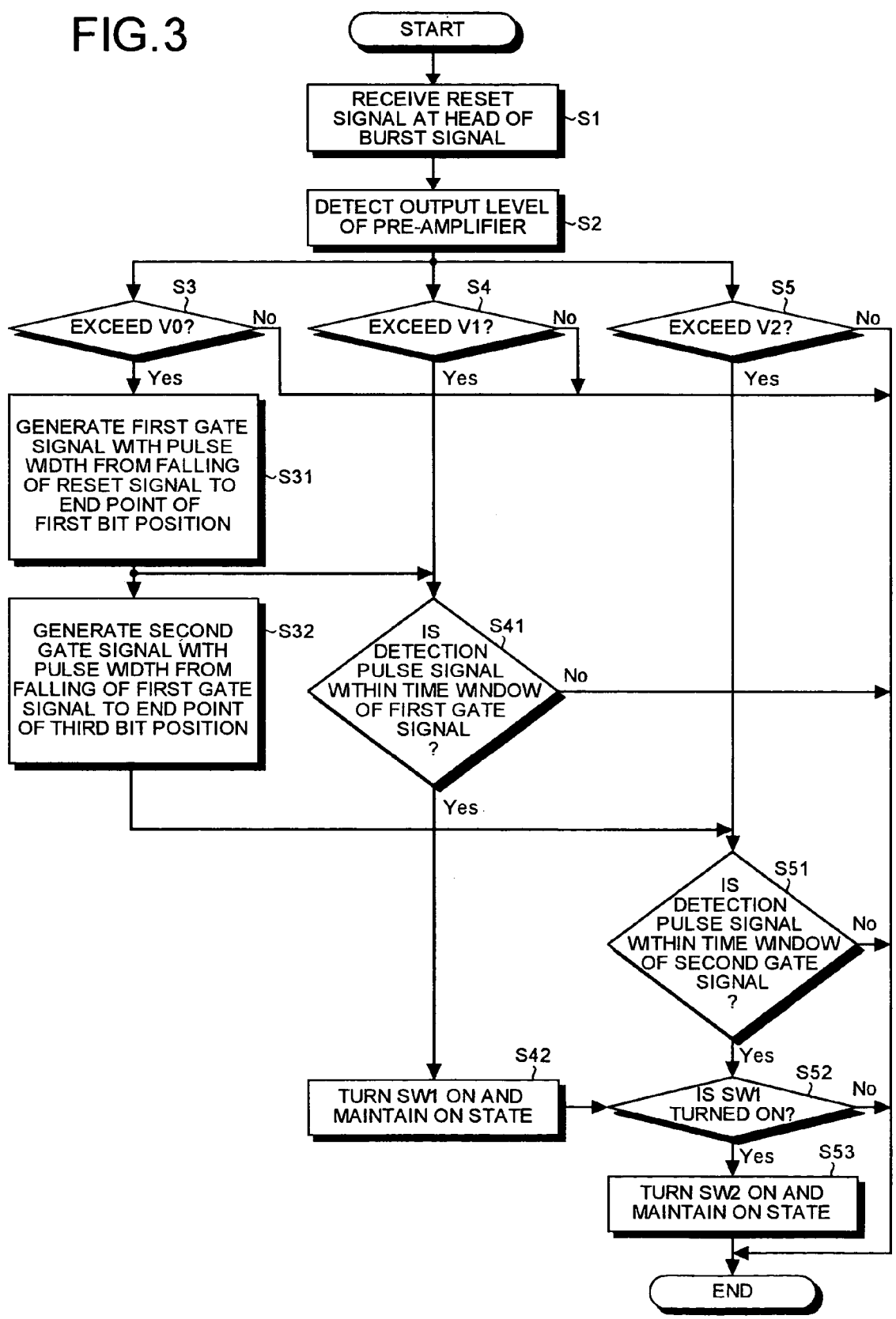
FIG. 3 is a flowchart illustrating control flow of the gain switching circuit shown in FIG. 1.

The operation of the gain switching circuit for a preamplifier according to the present embodiment will be explained with reference to FIG. 1 to FIG. 3. FIG. 2 is a time chart of an example of the operation of the gain switching circuit shown in FIG. 1. FIG. 3 is a flowchart illustrating control flow of the gain switching circuit shown in FIG. 1.

Figure 5:
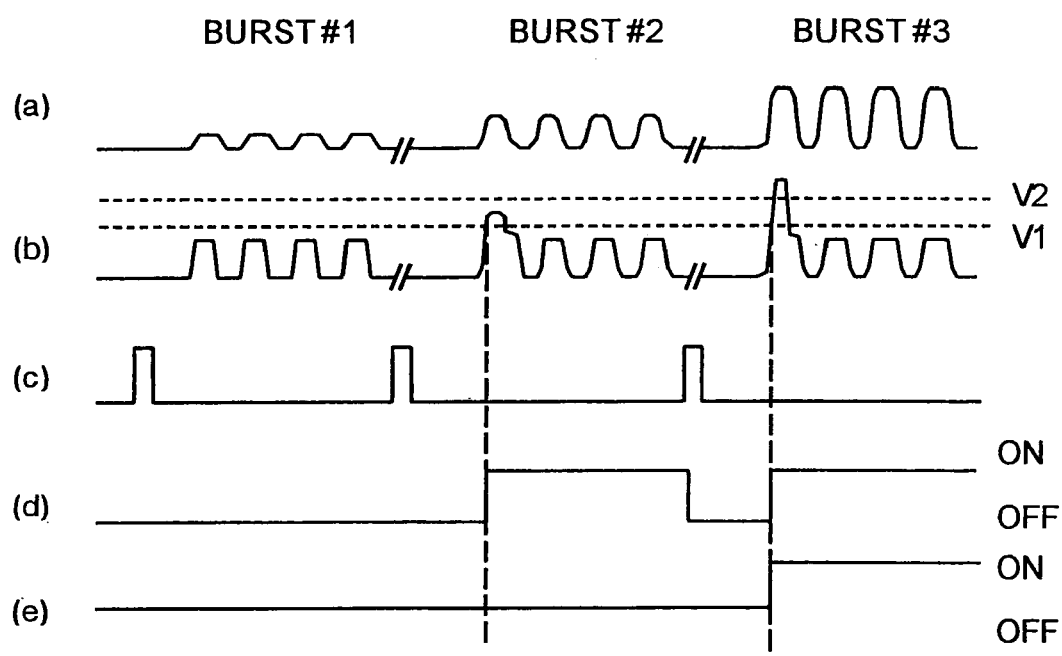
FIG. 5 is a time chart of operation of the conventional gain switching circuit.
Figure 6:
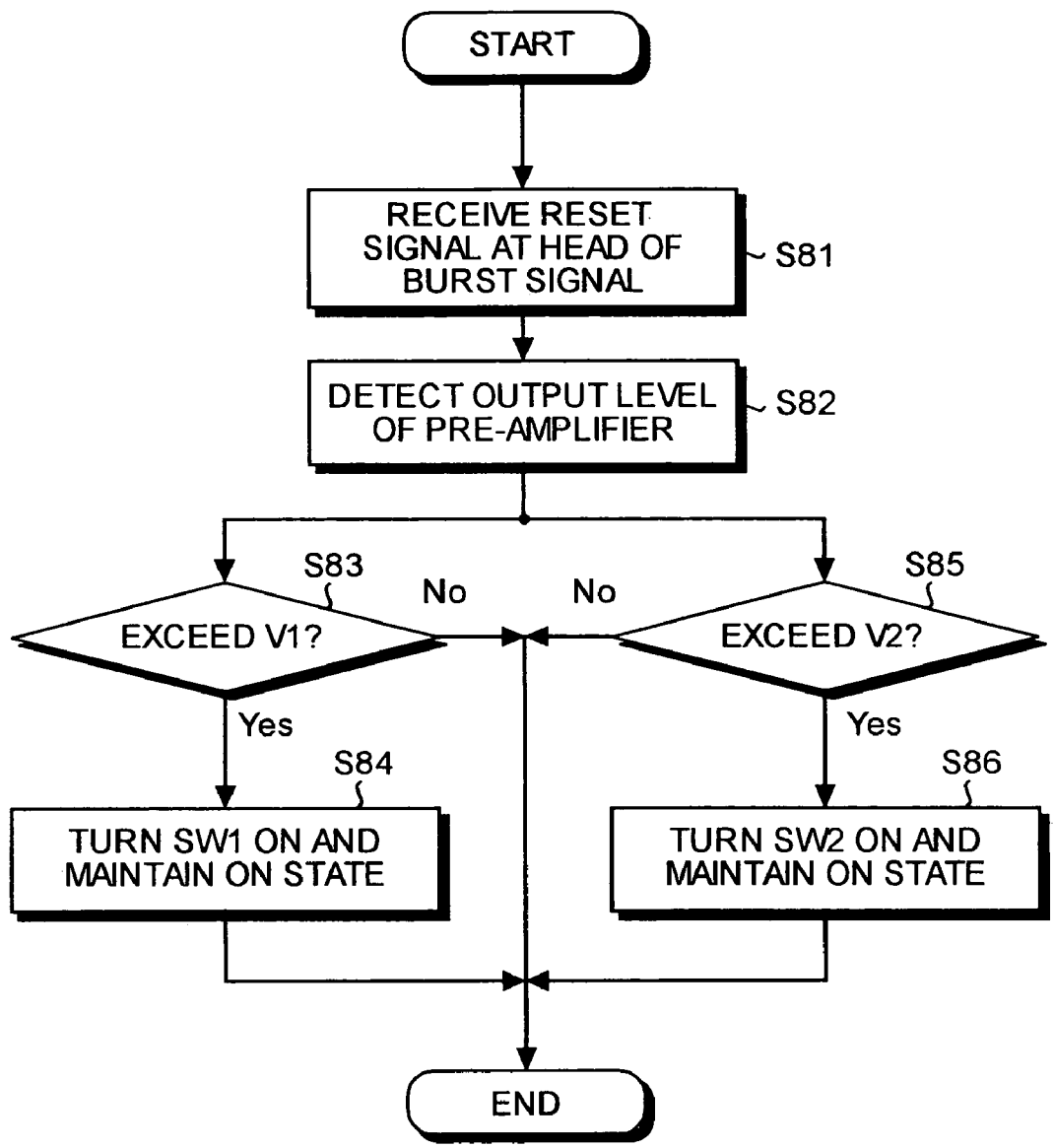
FIG. 6 is a flowchart illustrating control flow of the conventional gain switching circuit.

One example of the gain switching operation will be explained with reference to FIG. 1 and FIG. 2. To facilitate the understanding, FIG. 2 is an illustration of the operation of a burst signal in a format similar to that shown in FIG. 5.

In FIG. 2, (A) is a waveform diagram of current output from the photodetector 1, that is, a waveform of current input to the TIA 2. Light burst signals are input to the photodetector 1 in the order of bursts #1, #2, and #3. The bursts #1, #2, and #3 are data signals having a bit pattern of "1010" respectively. The amplitude increases in this order.

In FIG. 2, (B) is a waveform diagram of a relationship between a waveform of an output voltage (Vout) B from the TIA 2 and the reference voltages V0, V1, and V2. The output voltage (Vout) B from the TIA 2 to the burst #1 is at the reference voltage V0 or below. The output voltage (Vout) B from the TIA 2 to the burst #2 exceeds the reference voltage V1, but does not exceed the reference voltage V2. The output voltage (Vout) B from the TIA 2 to the burst #3 exceeds the reference voltage V2.

In FIG. 2, (C) is a waveform diagram of the reset signal (RESET) C. In (C), the reset signal (RESET) C is input at the head of the bursts #1, #2, and #3 respectively. Accordingly, the gate generation circuit 18 and the level holding circuits 22 and 23 are at the initialized state at the head of each burst signal. The SW 9 and SW 10 are in the OFF (open) operation state at the head of each burst signal. In other words, the TIA 2 is in the conversion gain determined by the feedback resistor 2b at the head of each burst signal.

In FIG. 2, (D) is a waveform diagram of the operation of the level detection circuit 15. As the amplitude of the burst #1 is at or below the reference voltage V0, the output D from the level detection circuit 15 is at the level "0". As the amplitudes of the bursts #2 and #3 exceed the reference voltage V0, the output D from the level detection circuit 15 forms a waveform that alternately repeats the level "1" and the level "0" corresponding to each bit of the burst signal.

In FIG. 2, (E) is a waveform diagram of the operation that the gate generation circuit 18 generates the first gate signal E. In the burst #1, the gate generation circuit 18 is initialized in response to a rise of the reset signal (RESET) C that leads the burst #1, and sets the output to the level "1" in response to a falling of the reset signal (RESET) C. As the output D from the level detection circuit 15 is at the level "0", the gate generation circuit 18 maintains the output at the level "1" until when the reset signal (RESET) C that leads the burst #1 is input. When the reset signal (RESET) C is input, the gate generation circuit 18 is initialized, and the circuit 18 sets the output to the level "0".

The gate generation circuit 18 sets the output E to the level "1" in response to the falling of the reset signal (RESET) C that leads the burst #2. This time, the output from the level detection circuit 15 forms a waveform that alternately repeats the level "1" and the level "0". Therefore, the output from the level detection circuit 15 first becomes at the level "1", and the gate generation circuit 18 maintains the output E at the level "1" until when the output falls to the level "0". The gate generation circuit 18 carries out a similar operation in the burst #3.

The output from the level detection circuit 15 first becomes at the level "1" at the first bit position. In other words, in the situation that the level detection circuit 15 detects a burst signal of which amplitude exceeds the reference voltage V0, the gate generation circuit 18 generates the first gate signal E having a pulse width from the falling of the reset signal (RESET) C to the end of the first bit. This first gate signal E is applied to the judgment circuit 19.

In FIG. 2, (H) is a waveform diagram of the operation that the gate generation circuit 18 generates the second gate signal H after generating the first gate signal E. In FIG. 2, (H), the gate generation circuit 18 maintains the output level H at the level "1" during a period from the falling of the first gate signal E until the output from the level detection circuit 15 becomes at the level "1" at the second time and falls to the level "0". The output from the level detection circuit 15 becomes at the level "1" at the second time at the third bit position. In other words, the gate generation circuit 18 generates the second gate signal H having a pulse width from the falling of the first gate signal E to the end of the third bit. This second gate signal H is applied to the judgment circuit 20.

In FIG. 2, (F) is a waveform diagram of the operation of the level detection circuit 16. As the amplitude of the burst #1 is at or below the reference voltage V0, the output from the level detection circuit 16 is at the level "0". As the first bit of the burst #2 exceeds the reference voltage V0, the detection pulse signal F having a pulse width of a time window that exceeds the reference voltage V1 at the timing of the first bit is output to the judgment circuit 19.

As the first bit and the third bit of the burst #3 exceed the reference voltage V1, the detection pulse signal F having a pulse width of a time window that exceeds the reference voltage V1 at the timing of the first bit and the third bit respectively is output to the judgment circuit 19.

In FIG. 2, (G) is a waveform diagram of the operation of the judgment circuit 19 and the level holding circuit 22. As the burst #1 is at or below the reference voltage V1, there is no input to the judgment circuit 19. The TIA 2 amplifies the original conversion gain in the burst #1.

On the other hand, in the burst #2, the first gate signal E and the detection pulse signal F are input to the judgment circuit 19. The judgment circuit 19 outputs the SW control signal to the level holding circuit 22 only when the detection pulse signal F is input to the time window of the first gate signal E. The level holding circuit 22 applies the input SW control signal to the gate electrode of the SW 9 as the SW operation signal G, and also outputs the SW control signal to the judgment circuit 21. The level holding circuit 22 holds the SW control signal until when the reset signal (RESET) C is input, thereby to keep the SW 9 in the ON state. The TIA 2 carries out the switching of the original conversion gain to a small conversion gain that is determined by a parallel resistance of the feedback resistor 2b and the resistor 6, at the first bit position of the burst #2.

Similarly, in the burst #3, the judgment circuit 19 and the level holding circuit 22 operate, thereby to keep the SW 9 in the ON state. However, as the third bit of the burst #3 exceeds the reference voltage V2, the operations shown in FIGS. 2I and 2J are carried out in parallel.

In FIG. 2, (I) is a waveform diagram of the operation of the level detection circuit 17. As the amplitudes of the burst #1 and the burst #2 are at or below the reference voltage V2, the output from the level detection circuit 17 is at the level "0".

On the other hand, as the first bit and the third bit of the burst #3 exceed the reference voltage V2, the detection pulse signal I having a pulse width of a time window that exceeds the reference voltage V2 at the timings of the first bit and the third bit are output to the judgment circuit 20.

In FIG. 2, (J) is a waveform diagram of the operations of the judgment circuit 20, the level holding circuit 23, and the judgment circuit 21. The judgment circuit 20 outputs the SW control signal to the level holding circuit 23 only when the detection pulse signal I is input to the time window of the second gate signal H. In other words, the detection pulse signal I generated at the first bit position is not within the time window of the second gate signal H, and is therefore invalid. The detection pulse signal I generated at the third bit position is within the time window of the second gate signal H, and is therefore valid.

The level holding circuit 23 outputs the input SW control signal to the judgment circuit 21, and holds this signal until when the reset signal (RESET) C is input. Upon receiving the SW control signal output from the level holding circuit 23, the judgment circuit 21 applies the SW control signal output from the level holding circuit 23 to the gate electrode of the SW 10 as the SW operation signal J, when the SW operation signal G is held at the level "1".

As a result, the TIA 2 carries out the switching of the original conversion gain to a small conversion gain that is determined by a parallel resistance of the feedback resistor 2b and the resistor 6, at the first bit position of the burst #3. Thereafter, at the third bit position, the TIA 2 carries out the switching of the conversion gain to a smaller conversion gain that is determined by a parallel connection further including the resistor 7.

Figure 7:
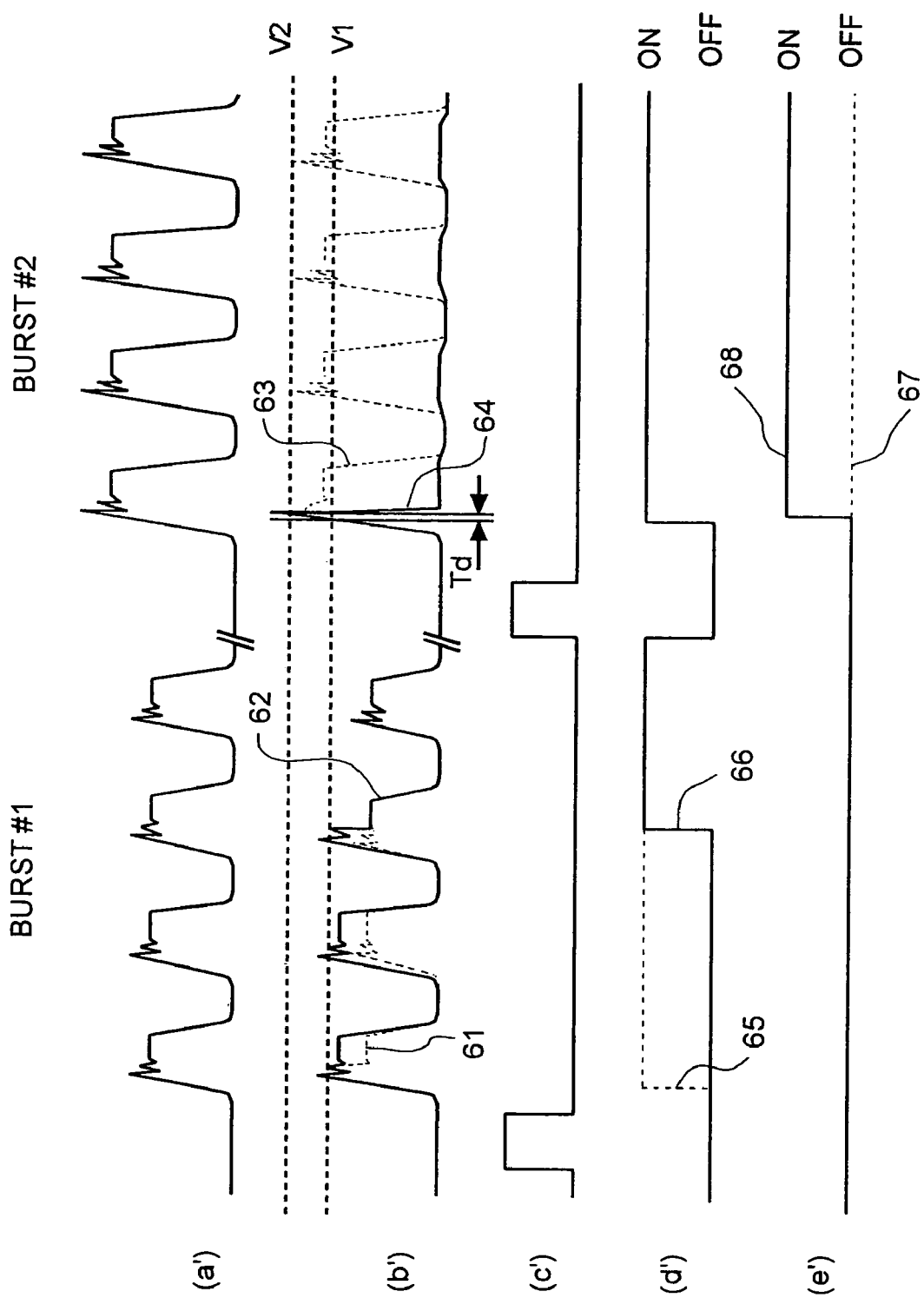
FIG. 7 is a time chart illustrating an example of a malfunctioning of the conventional gain switching circuit.
Figure 8:
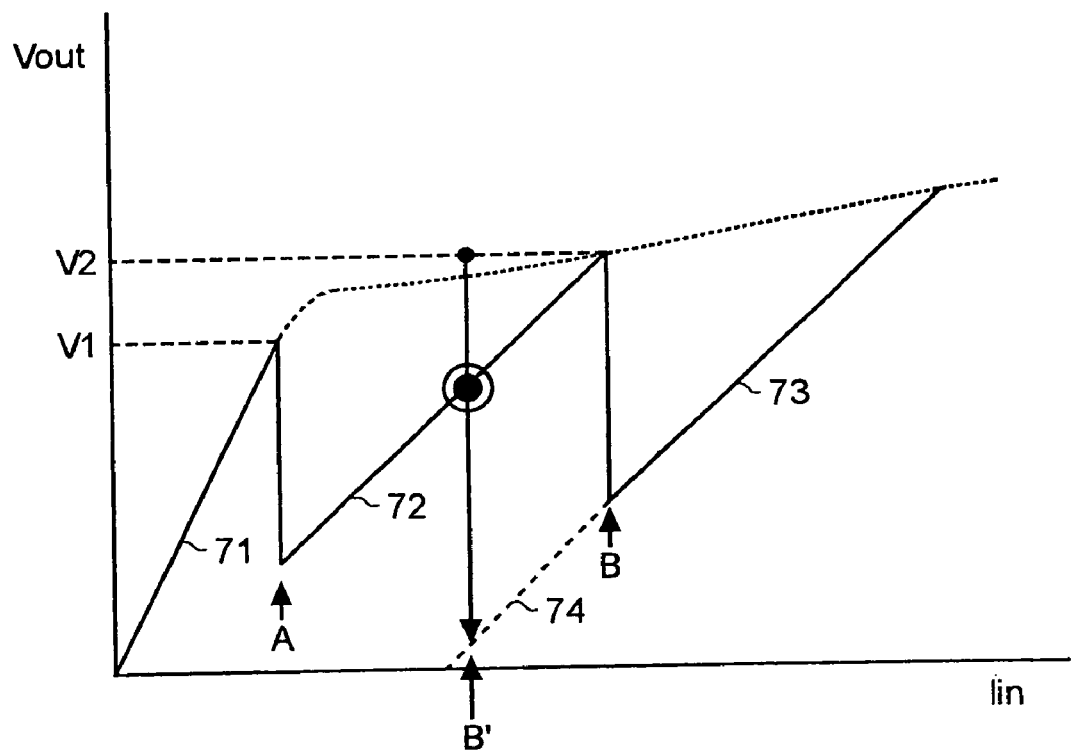
FIG. 8 is a graph of input-output characteristic of a pre-amplifier shown in FIG. 4.

The operation in the first burst and the second burst according to the present embodiment as shown in FIG. 7 will be explained. When the amplitude of the first bit of the first burst exceeds the reference voltage V1, this can be securely hunt by the first gate signal E. Therefore, the gain of the TIA 2 can be switched from the first bit position. On the other hand, even when the amplitude exceeds the reference voltage V1 after the first bit position, the first gate signal E is not generated. Therefore, the gain of the TIA 2 is not switched in the middle of the first burst and thereafter.

When the second burst has a waveform as indicated by a solid line 64, the amplitude exceeds the reference voltage V1 and the reference voltage V2 at the first bit position. Therefore, the detection pulse signal F and the detection pulse signal I are generated. However, only the first gate signal E is generated, and the second gate signal H is not generated. Accordingly, the gain of the TIA 2 is switched by only the SW 9 at the first bit position, which prevents the SW 10 from being erroneously turned ON.

In the present embodiment, the interval between the reference voltage V0 and the reference voltage V1 is set relatively large, by taking into account that the burst signal waveform has various kinds of distortions such as ringing and amplitude fluctuation as shown in FIG. 7. Therefore, even when the signal waveform has a fluctuation, the SW 9 does not switch over the gain until the amplitude reaches a certain level. In other words, it becomes possible to prevent a frequent occurrence of unnecessary switching of gain.

A general operation will be explained based on FIG. 3 with reference to FIG. 1. In FIG. 3, a SW 1 refers to the SW 9, and a SW 2 refers to the SW 10. At step S1, the gain switching circuit 3 receives the reset signal (RESET) at the head of the burst signal. In other words, when the reset signal (RESET) is input, the gate generation circuit 18 and the level holding circuits 22 and 23 are reset. The SW 1 and the SW 2 are in the OFF state, thereby to return the gain of the TIA 2 to the original conversion gain.

When the light burst signal is input to the photodetector 1, the level detection circuits 15, 16, and 17 detect whether the output levels of the TIA 2 exceed the respective threshold values V0, V1, and V2 (step S2). When the output level does not exceed the reference voltage V0 (No at step S3), or when the output level does not exceed the reference voltage V1 (No at step S4), or when the output level does not exceed the reference voltage V2 (No at step S5), the SW 1 and the SW 2 are not controlled.

When the output level exceeds the reference voltage V0 (Yes at step S3), the gate generation circuit 18 generates the first gate signal E having a pulse width from the falling of the reset signal (RESET) to the end of the first bit position (step S31). Further, the gate generation circuit 18 generates the second gate signal F having a pulse width from the falling of the first gate signal to the end of the third bit position (step S32).

When the output level exceeds the reference voltage V1 (Yes at step S4), the judgment circuit decides whether this exceeding timing coincides with the timing of the first gate signal generated at step S31 (step S41). When these timings coincide with each other (Yes at step S41), the SW 1 it turned ON, and this ON state is maintained (step S42). On the other hand, when these timings do not coincide with each other (No at step S41), the control operation ends without turning ON the SW 1. With this arrangement, the gain can be switched at only a specific bit position (i.e., first bit position), and the occurrence of a gain switching at an optional bit position within the burst signal can be prevented.

When the output level exceeds the reference voltage V2 (Yes at step S5), the judgment circuit decides whether this exceeding timing coincides with the timing of the second gate signal generated at step S32 (step S51). When these timings do not coincide with each other (No at step S51), the control operation ends without turning ON the SW 2. When these timings coincide with each other (Yes at step S51), the judgment circuit decides whether the SW 1 is in the ON state at step S42 (step S52). When the SW 1 is in the ON state (Yes at step S52), the SW 2 is turned ON at other specific bit position (i.e., third bit position), and this ON state is maintained (step S53). On the other hand, when the SW 1 is not in the ON state (No at step S52), the control operation ends without turning ON the SW 2.

The SW 1 is operated at a specific bit position (i.e., first bit position) at which the leading SW 1 is to be operated. When the SW 2 should also be operated, the SW 2 is operated at a specific bit position (i.e., third bit position). Consequently, both the SW 1 and the SW 2 are securely operated, thereby to obtain a suitable conversion gain. When the SW 1 is not operated at a specific bit position (i.e., first bit position) at which the leading SW 1 is to be operated, the SW 2 is not operated even if a cause of operating the SW 2 occurs. Consequently, it is possible to prevent the occurrence of an erroneous setting of a conversion gain.

When the SW 1 and the SW 2 connected in parallel to the feedback resistor of the TIA are operated to switch the feedback resistance for each reception burst, the feedback resistance is reduced due to this switching. In this case, a wide-area cutoff frequency becomes large, and a phase margin becomes small, which has a problem of making the circuit oscillate easily. It is known that this problem can be solved by reducing the open gain of the TIA in parallel with the operation of the SW 1 and the SW 2. It is needless to mention that the control signal for operating the SW 1 and the SW 2 also becomes the control signal for reducing the gain of the open gain of the TIA at the same time.

It is needless to mention that the above operation can be performed without any problem even when the serial circuit of the resistor 5 and the diode 8 is provided. While the bit pattern of the burst signal is explained in the format of "1010", the present invention can also be applied when the bit pattern has "0" after "1", such as, "110110", "11001100", and "11101110", for example. While the amplitude of each input burst signal sequentially increases in the above explanation for the sake of convenience, it is needless to mention that the above operation can also be carried out even when the amplitude increases not in order.

While the first bit position and the third bit position are taken up as an example of specific bit positions in the present embodiment, it is also possible to determine these bit positions according to characteristics of the bit pattern and the burst signals that are employed. It is explained in the above that the invention is applied to the pre-amplifier for a photodetector in an optical communication system. It is needless to mention that the invention can also be applied in a similar manner to a pre-amplifier for a light signal measuring unit, and a photo detector for a monitor or the like.

While the presence of two switches is assumed in the present embodiment, the present invention is not limited to this assumption. Only one or an optional number of three or more serial circuits of a switch and a resistor may be provided. In other words, an optional number of three or more gain switching circuits 3 are provided to close a third switch of an $i_{th}$, where 3 i N, serial circuit at a corresponding specific bit position, upon occurrence of a situation that the third switch of the $i_{th}$ serial circuit is to be closed after the gain switching circuit receives the electric voltage signal, provided that third switches of all the serial circuits before the $i_{th}$ serial circuit are closed.

As explained above, according to the present invention, the conversion gain can be securely switched at a specific bit position of the burst signal. Further, it is possible to securely prevent the occurrence of a switching of the conversion gain at an optional bit position within the burst signal. When a situation that the second switch must be closed occurs, the second switch can be closed subject to the condition that the leading first switch is operated. Therefore, a proper conversion gain can be set, and an erroneous setting of the conversion gain can be prevented.

Moreover, the conversion gain can be automatically switched according to a size of the input amplitude of the pre-amplifier.

Moreover it is possible to prevent a frequent occurrence of unnecessary switching of a conversion gain.

Moreover, the switching of a conversion gain can be controlled more accurately.

INDUSTRIAL APPLICABILITY

As explained above, the gain switching circuit and the method of switching gain of a pre-amplifier can be suitably applied to a photodetector in an optical communication system, a light signal measuring unit, and a photodetector for a monitor or the like.

What is claimed is:

1. A gain switching circuit for a pre-amplifier, which amplifies an output current of a photodetector, which converts a burst optical signal into an electrical signal, to generate an electric voltage signal, the pre-amplifier including a parallel connected operation amplifier and a feedback resistor, wherein a first serial circuit including a first resistor and a first switch is connected in parallel with the pre-amplifier, and a second serial circuit including a second resistor and a second switch is connected in parallel with the first serial circuit, comprising:

an arrangement to receive the electric voltage signal, close the first switch at a specific bit position within a burst of the electric voltage signal, close the second switch at an other specific bit position within the burst of the electric signal, upon occurrence of a situation that the second switch is to be closed, provided that the first switch is closed, wherein the arrangement includes a signal generating unit that determines an output level of the electric voltage signal, checks whether the output level exceeds a first reference voltage, and if the output level exceeds the first reference voltage, generates a first gate signal at the specific bit position and generates a second gate signal at the other specific bit position.

2. The gain switching circuit according to claim 1, wherein a third serial circuit including a third resistor and a diode is connected in parallel with the pre-amplifier.

3. The gain switching circuit according to claim 1, wherein the arrangement includes a first control unit that determines an output level of the electric voltage signal, checks whether the output level exceeds a second reference voltage, which is higher than the first reference voltage, and if the output level exceeds the second reference voltage, checks whether a timing at which the output level exceeds the second reference voltage is within a time window of the first gate signal, and if the timing is within the time window of the first gate signal, closes the first switch; and a second control unit that determines an output level of the electric voltage signal, checks whether the output level exceeds a third reference voltage, which is higher than the second reference voltage, and if the output level exceeds the third reference voltage, checks whether a timing at which the output level exceeds the third reference voltage is within a time window of the second gate signal, and if the timing is within the time window of the second gate signal, closes the second switch.

4. The gain switching circuit according to claim 3, further comprising:

a first voltage source that produces the first reference voltage;

a second voltage source that produces the second reference voltage, wherein there is a relatively large voltage difference between the first reference voltage and the second reference voltage; and a third voltage source that produces the third reference voltage.

5. The gain switching circuit according to claim 1, wherein the arrangement includes a first level detection circuit that determines an output level of the electric voltage signal, checks whether the output level exceeds a first reference voltage, and if the output level exceeds the first reference voltage, outputs a first pulse signal within a time window in which an output level of the electric voltage signal exceeds the first reference voltage;

a second level detection circuit that determines an output level of the electric voltage signal, checks whether the output level exceeds a second reference voltage, which is higher than the first reference voltage, and if the output level exceeds the second reference voltage, outputs a second pulse signal within a time window in which the output level exceeds the second reference voltage;

a third level detection circuit that determines an output level of the electric voltage signal, checks whether the output level exceeds a third reference voltage, which is higher than the second reference voltage, and if the output level exceeds the third reference voltage, outputs a third pulse signal within a time window in which the output level exceeds the third reference voltage;

a gate signal generation circuit that generates a first gate signal and a second gate signal so that a pulse width of the first gate signal is between a falling of a reset signal from an external input and a falling of the first pulse signal output from the first level detection circuit corresponding to the specific bit position, and a pulse width of the second gate signal is between a falling of the first gate signal and a falling of the first pulse signal output from the first level detection circuit corresponding to the other specific bit position;

a first judgment circuit that outputs a first judgment signal upon input of the second pulse signal within a pulse width of the first gate signal;

a first holding circuit that holds the first judgment signal until the next input of the reset signal, and provides a control to close the first switch;

a second judgment circuit that outputs a second judgment signal upon input of the third pulse output within a pulse width of the second gate signal;

a second holding circuit that holds the second judgment signal until the next input of the reset signal; and a third judgment circuit that determines whether the first holding circuit outputs the first judgment signal and the second holding circuit outputs the second judgment signal, and if the first holding circuit outputs the first judgment signal and the second holding circuit outputs the second judgment signal, provides a control to close the second switch.

6. The gain switching circuit according to claim 5, further comprising:

a first voltage source that produces the first reference voltage;

a second voltage source that produces the second reference voltage, wherein there is a relatively large voltage difference between the first reference voltage and the second reference voltage; and a third voltage source that produces the third reference voltage.

7. The gain switching circuit according to claim 1, wherein N serial circuits, where $N \geq 3$ are connected in parallel with the pre-amplifier, wherein each serial circuit includes a resistor and a switch, and the arrangement receives the electric voltage signal, and then, upon occurrence of a situation that the switch of an i-th serial circuit, where $3 \leq i \leq N$, is to be closed, closes the switch of the i-th serial circuit at a corresponding specific bit position, provided that the switches of all the serial circuits before the i-th serial circuit are closed.

8. A method of switching gain of a pre-amplifier, which amplifies an output current of a photodetector, which converts a burst optical signal into an electrical signal, to generate an electric voltage signal, the pre-amplifier including a parallel connected operation amplifier and a feedback resistor, wherein a first serial circuit including a first resistor and a first switch is connected in parallel with the pre-amplifier, and a second serial circuit including a second resistor and a second switch is connected in parallel with the first serial circuit, comprising:

receiving the electric voltage signal;

closing the first switch at a specific bit position within a burst of the electric voltage signal based on the electric voltage signal;

closing the second switch at an other specific bit position within the burst of the electric voltage signal, upon occurrence of a situation that the second switch is to be closed, provided that the first switch is closed, wherein N third serial circuits, where N>=3, are connected in parallel with the pre-amplifier, wherein each third serial circuit includes a third resistor and a third switch; and closing a third switch of an I-th serial circuit, where 3<=i<=N, at a corresponding specific bit position, upon occurrence of a situation that the third switch of the I-th serial circuit is to be closed after receiving the electric voltage signal, provided that third switches of all the serial circuits before the I-th serial circuit are closed.

9. The method according to claim 8, further comprising:

determining an output level of the electric voltage signal, checking whether the output level exceeds a first reference voltage, and if the output level exceeds the first reference voltage, generating a first gate signal at the specific bit position and generating a second gate signal at the other specific bit position;

determining an output level of the electric voltage signal, checking whether the output level exceeds a second reference voltage, which is higher than the first reference voltage, and if the output level exceeds the second reference voltage, checking whether a timing at which the output level exceeds the second reference voltage is within a time window of the first gate signal, and if the timing is within the time window of the first gate signal, closing the first switch; and determining an output level of the electric voltage signal, checking whether the output level exceeds a third reference voltage, which is higher than the second reference voltage, and if the output level exceeds the third reference voltage, checking whether a timing at which the output level exceeds the third reference voltage is within a time window of the second gate signal, and if the timing is within the time window of the second gate signal, closing the second switch.

10. The method according to claim 8, further comprising:

determining an output level of the electric voltage signal, checking whether the output level exceeds a first reference voltage, and if the output level exceeds the first reference voltage, outputting a first pulse signal within a time window in which an output level of the electric voltage signal exceeds the first reference voltage;

determining an output level of the electric voltage signal, checking whether the output level exceeds a second reference voltage, which is higher than the first reference voltage, and if the output level exceeds the second reference voltage, outputting a second pulse signal within a time window in which the output level exceeds the second reference voltage;

determining an output level of the electric voltage signal, checking whether the output level exceeds a third reference voltage, which is higher than the second reference voltage, and if the output level exceeds the third reference voltage, outputting a third pulse signal within a time window in which the output level exceeds the third reference voltage;

generating a first gate signal and a second gate signal so that a pulse width of the first gate signal is between a falling of a reset signal from an external input and a falling of the first pulse signal output corresponding to the specific bit position, and a pulse width of the second gate signal is between a falling of the first gate signal and a falling of the first pulse signal corresponding to the other specific bit position;

generating and outputting a first judgment signal upon input of the second pulse within a pulse width of the first gate signal;

holding the first judgment signal until the next input of the reset signal, and providing a control to close the first switch;

generating and outputting a second judgment signal upon input of the third pulse output within a pulse width of the second gate signal;

holding the second judgment signal until the next input of the reset signal; and determining whether the first judgment signal and the second judgment signal that are held are output, and if the first judgment signal and the second judgment signal are output, providing a control to close the second switch.

* * * * *